(12) United States Patent
Wang et al.

(10) Patent No.: US 7,130,192 B2
(45) Date of Patent: Oct. 31, 2006

(54) HEAT DISSIPATING DEVICE

(75) Inventors: Yaxiong Wang, Austin, TX (US); Shun Chi Dong, Austin, TX (US); Chung-Yuan Huang, Austin, TX (US); Aimin Huang, Shenzhen (CN)

(73) Assignees: Fu Zhun Precision Industry (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 172 days.

(21) Appl. No.: 10/833,976

(22) Filed: Apr. 27, 2004

(65) Prior Publication Data

US 2005/0237719 A1    Oct. 27, 2005

(51) Int. Cl.
*H05K 7/20* (2006.01)

(52) U.S. Cl. ............... 361/697; 165/80.3; 165/104.33; 165/121; 361/700

(58) Field of Classification Search ................ 361/700, 361/688
See application file for complete search history.

(56) References Cited

U.S. PATENT DOCUMENTS

| 6,779,595 | B1 * | 8/2004 | Chiang | 165/104.33 |
| 2005/0073811 | A1 * | 4/2005 | Wang et al. | 361/688 |

* cited by examiner

*Primary Examiner*—Gregory Thompson
(74) *Attorney, Agent, or Firm*—Wei Te Chung

(57) ABSTRACT

A heat dissipating device is adapted to remove heat from an electronic package. The heat dissipating device includes a heat sink (10) and a fan (30) generating airflow. The heat sink has a base (11) and a plurality of first fins (13) extending therefrom. First airflow channels (132) are defined between the first fins. A plurality of second fins (15) are transversely attached to the first fins. The second fins have second airflow channels (152) defined therebetween. The second airflow channels communicate with the first airflow channels.

17 Claims, 5 Drawing Sheets

HEAT DISSIPATING DEVICE

BACKGROUND OF THE INVENTION

1. Field of the Invention

The present invention relates to a heat dissipating device, and particularly to a heat dissipating device which has improved airflow channels.

2. Prior Art

Electronic devices such as central processing units (CPUs) generate a lot of heat during normal operation. This can deteriorate their operational stability and damage associated electronic devices. Thus the heat must be removed quickly to ensure normal operation.

A conventional heat dissipation assembly as shown in FIG. 5 includes a fan 1 and a heat sink 3. The fan 1 is secured on the heat sink 3. The heat sink 3 comprises a base 4, and a plurality of parallel fins 5 extending upwardly from the base 4. A plurality of airflow channels 6 are formed between the fins 5. The channel 6 is often relatively narrow. When the airflow generated by the fan goes through the channels 6, there is always resistance to the airflow caused by the surface of the fins 5. If the channel 6 is long, the airflow is impeded significantly. The heat cannot be carried out easily. This reduces the efficiency of the heat dissipation assembly greatly.

SUMMARY OF THE INVENTION

Accordingly, an object of the present invention is to provide a heat dissipating device which has improved airflow channels reducing resistance to the airflow.

To achieve the above-mentioned object, a heat dissipating device in accordance with the present invention comprises a heat sink and a fan generating airflow. The heat sink has a base and a plurality of first fins extending therefrom. First airflow channels are defined between the first fins. A plurality of second fins are transversely attached to the first fins. The second fins have second airflow channels defined therebetween. The second airflow channels communicate with the first airflow channels.

Other objects, advantages and novel features of the present invention will be drawn from the following detailed description of a preferred embodiment of the present invention with attached drawings, in which:

DETAILED DESCRIPTION OF THE INVENTION

Figure 1:
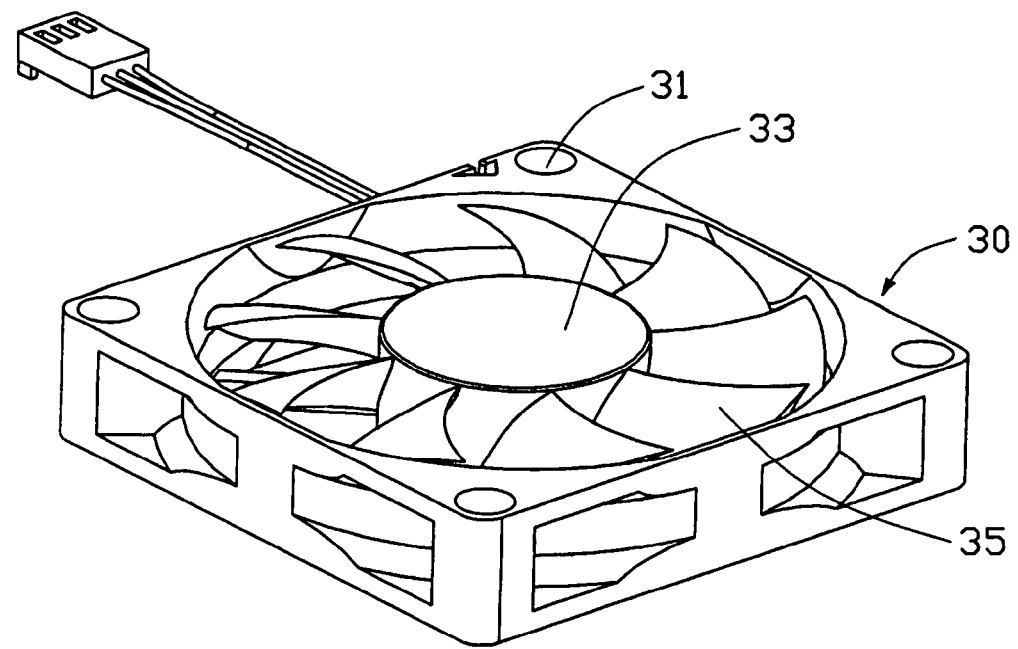
FIG. 1 is a partial exploded view of a heat dissipating device in accordance with a preferred embodiment of the present invention.
Figure 1:
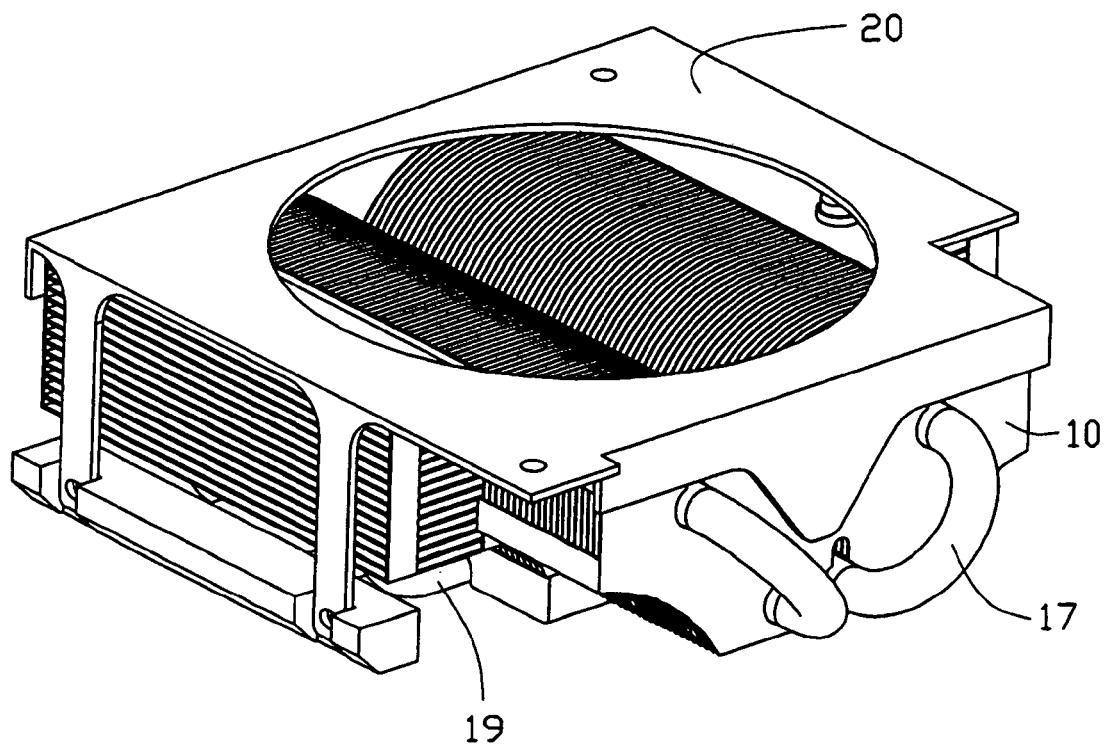

Referring to FIG. 1, a heat dissipating device in accordance with the preferred embodiment of the present invention comprises a fan 30, a fan holder 20 and a heat sink 10. A pair of first heat pipes 17 and a pair of second heat pipes 19 are inserted into the fins of the heat sink 10. The heat dissipating device is adapted for removing heat from an electronic package (not shown) thereunder.

The fan 30 has a rectangular frame with four through holes 31 defined at the four corners thereof. An impeller 33 is defined at the center and a plurality of blades 35 are radially mounted thereon.

Figure 2:
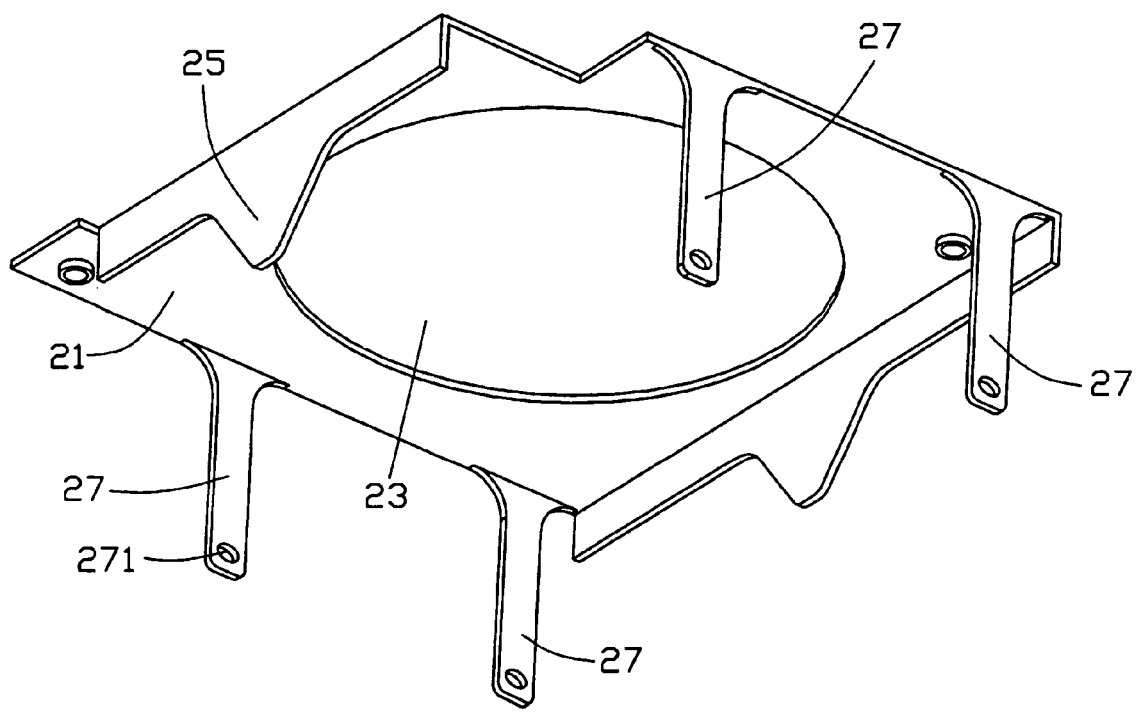
FIG. 2 is an isometric view of a fan holder of the heat dissipating device in FIG. 1.

Referring to FIG. 2, the fan holder 20 comprises a generally rectangular plate 21, four clasps 27 and two rims 25 extending downwardly therefrom. An opening 23 is defined in a middle of the plate 21 for providing airflow access from the fan 30 to the heat sink 10. The clasps 27 engage with the heat sink 10 for securing the fan holder 20 on the heat sink 10. The rims 25 abut on the front and back sides of the heat sink 10. Screw holes (not labeled) are defined on the plate 21 for securing the fan 30 thereon.

Figure 3:
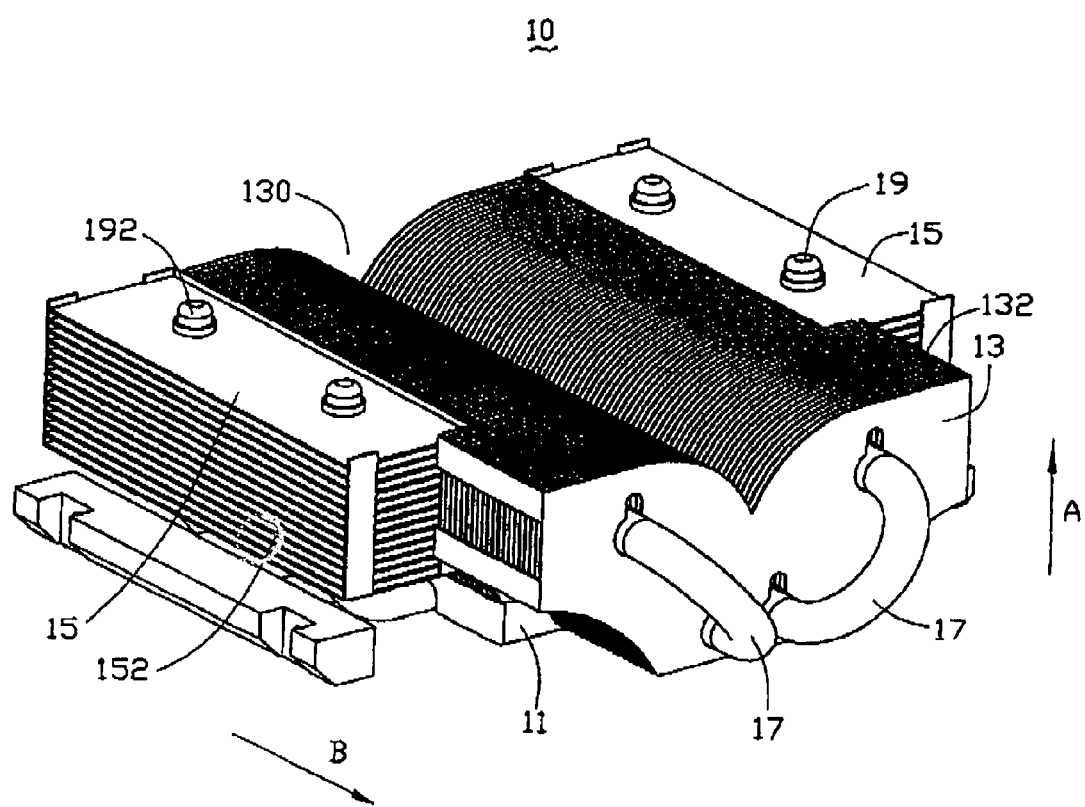
FIG. 3 is an isometric view of a heat sink of the heat dissipating device in FIG. 1.
Figure 4:
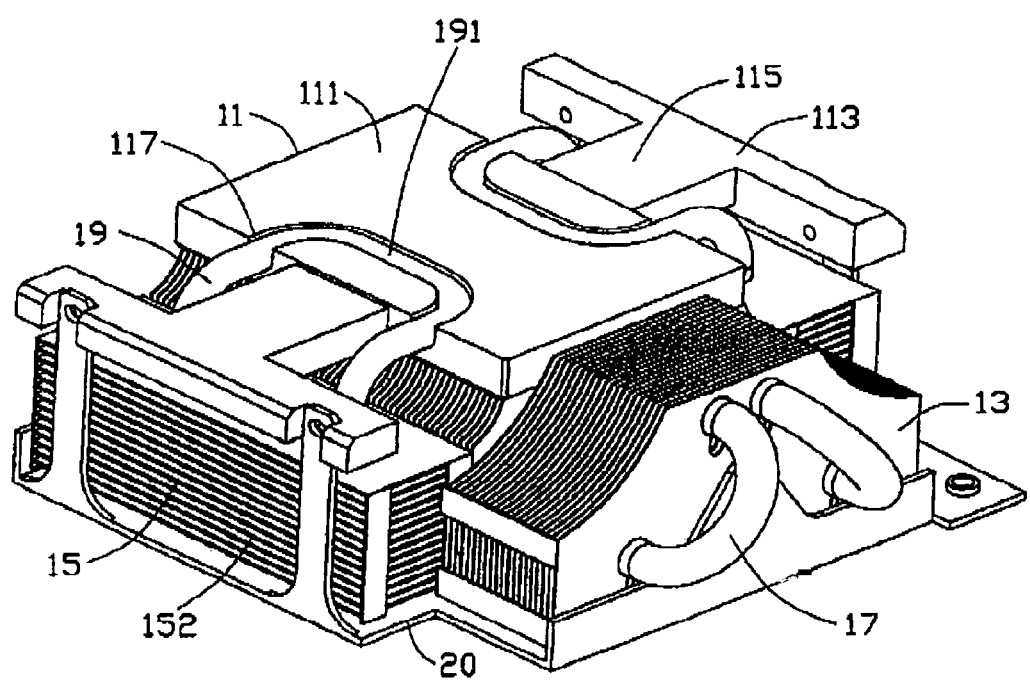
FIG. 4 is a bottom view of the assembly of the heat sink and the fan holder in FIG. 1.
Figure 5:
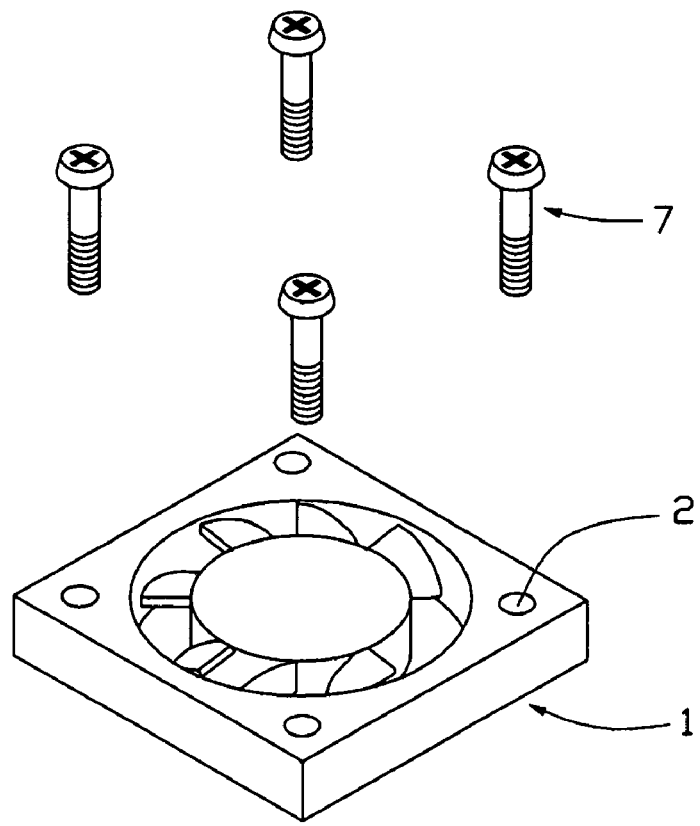
FIG. 5 is an isometric view of a conventional heat dissipating device.
Figure 5:
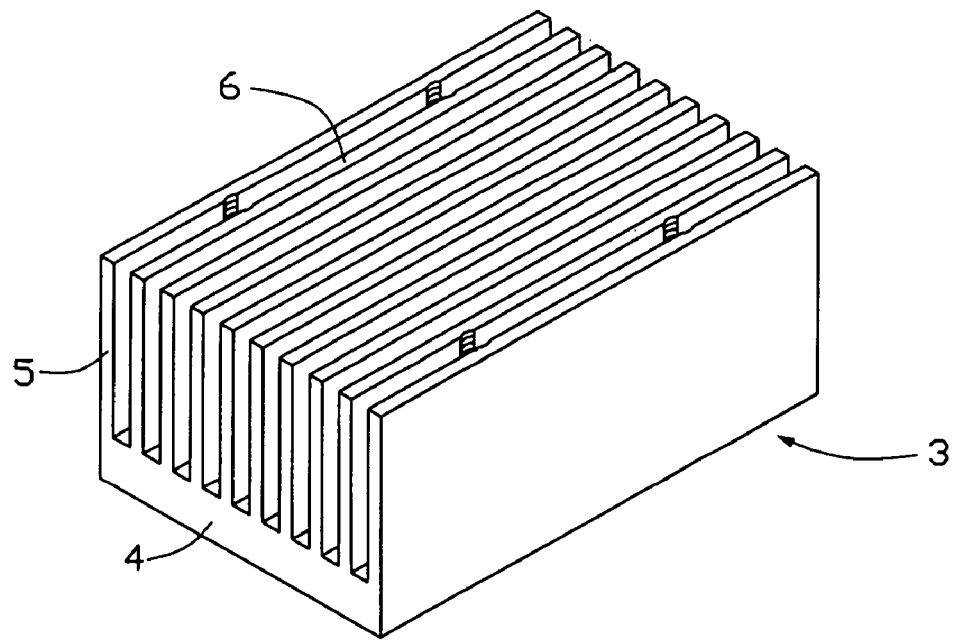

Referring to FIG. 3 and FIG. 4, the heat sink 10 comprises a base 11 and a plurality of parallel first fins 13. The base 11 has a first portion 111 for contacting the electronic package and a pair of second portions 113 at two sides. The second portion 113 connects the first portion 111 with a bridge portion 115. The second portion 113 is adapted for securing the fan holder 20 thereon. A pair of U-shaped grooves 117 is defined at the bottom of the first portion 111 for receiving the second heat pipe 19. The first fins 13 are a fin package in perpendicular arranged to the first portion 111 of the base 11. A plurality of airflow channels 132 is defined between adjacent first fins 13. The airflow generated by the fan 30 goes through the airflow channels 132 to carry the heat out. A V-shaped recess 130 is defined at the top of the first fins 13 for receiving the airflow generated by the fan 30. The first heat pipe 17 is U-shaped. A pair of the heat pipes 17 is perpendicularly inserted into the first fins 13.

A plurality of second fins 15 are transversely attached to two sides of the first fins 13. Thus, each of said first fins 13 extends along a first direction indicated by an arrow A across said second fins 15, and each of said second fins 15 extends along a second direction indicated by an arrow B across said first fins 13. It is preferable that each second fin 15 is parallel to the base 11 of the heat sink 10, and each first fin 13 is perpendicular to the base 11 of the heat sink 10. The second fins 15 have a plurality of airflow channels 152 defined therebetween. The second airflow channels 152 communicate with the first airflow channels 132. As a result, the airflow generated by the fan 30 is conducted from the first airflow channels 132 to the second airflow channels 152. When flowing into the second airflow channels 152, the airflow from each first airflow channel 132 branches and enters various second airflow channels 152. That is, the airflow is redistributed into the second airflow channels 152 when flowing from the first fins 13 to the second fins 15.

Referring to FIG. 4, each second heat pipe 19 is U-shaped and comprises a first section 191 located at a medium portion thereof and a pair of second sections 192 located at two ends of the first section 191. Both second sections 192 of the U-shaped second heat pipe 19 are folded up to perpendicularly insert into the second fins 15. The first section 191 of the second heat pipe 19 is held in the groove 117 of the base 11. Thus, the first section 191 of the heat pipe 19 extends along the second direction B and locates close to the base 11 where heat is absorbed, and the second sections 192 of the heat pipe 19 extend along the first direction A away from the base 11.

It is understood that the invention may be embodied in other forms without departing from the spirit thereof. Thus, the present example and embodiment t is to be considered in

What is claimed is:

1. A heat dissipating device, comprising:
    a heat sink having a base and a plurality of first fins extending therefrom, first airflow channels being defined between the first fins;
    a plurality of second fins with second airflow channels defined therebetween, the second fins being transversely attached to the first fins, the second airflow channels communicating with the first airflow channels;
    at least one heat pipe combined to the heat sink; at least one U-shaped groove is defined in the base of the heat sink for holding the at least one heat pipe therein; and
    a fan arranged on the heat sink for generating airflow.

2. The heat dissipating device as claimed in claim 1 further comprising a fan holder for holding the fan on the heat sink.

3. The heat dissipating device as claimed in claim 1, wherein the first fins perpendicular extend from the base.

4. The heat dissipating device as claimed in claim 1, wherein the first fins have a recess at the top thereof.

5. The heat dissipating device as claimed in claim 4, wherein the recess is V-shaped.

6. The heat dissipating device, comprising:
    a fan generating airflow; and
    a heat sink having a plurality of first fins with first airflow channels defined therebetween and a plurality of second fins with second airflow channels defined therebetween, the second airflow channels being nonparallel to the first airflow channels, the airflow being conducted through the first airflow channels and the second airflow channels sequentially, the airflow being redistributed into the second airflow channels when flowing from the first fins to the second fins;
    wherein the first airflow channels confront the second airflow channels, one of the first airflow channels confronts a number of the second airflow channels, and one of the second airflow channels confronts a number of the first airflow channels.

7. The heat dissipating device as claimed in claim 6, wherein the heat dissipating device further comprises a fan holder for holding the fan on the heat sink.

8. The heat dissipating device as claimed in claim 6, wherein the second fins are transversely attached to the first fins.

9. The heat dissipating device as claimed in claim 6, wherein the first fins perpendicular extend from the heat sink.

10. The heat dissipating device as claimed in claim 6, wherein the first fins have a V-shaped recess at the top thereof.

11. The heat dissipating device as claimed in claim 6, wherein each of the second airflow channels communicates with a plurality of the first airflow channels.

12. The heat dissipating device as claimed in claim 6, wherein each of said first fins extend along a first direction across said second fins, and each of said second fins extend along a second direction across said first fins.

13. The heat dissipating device as claimed in claim 12, wherein the first fins are located in a center portion of the heat sink and second fins are located on a periphery portion of the heat sink.

14. The heat dissipating device as claimed in claim 13, further including a heat pipe having a first section extending along the second direction and located close to a base where heat is absorbed, and a second section extending along the first direction relatively far away from the base.

15. The heat dissipating device as claimed in claim 7, wherein said holder encloses both said first fins and said second fins.

16. A heat dissipating device, comprising:
    a base adapted to be positioned onto an electronic device and including a first portion and a second portion;
    a plurality of first fins arranged on the first portion of the base;
    a plurality of second fins arranged on the second portion of the base and in nonparallel to the first fins; and
    a fan holder arranged on the second portion of the base and on which a fan is attached.

17. The heat dissipating device as claimed in claim 16, wherein the second fins are transversely attached to the first fins.

* * * * *